(12) United States Patent
Chlipala et al.

(10) Patent No.: US 6,700,944 B1
(45) Date of Patent: Mar. 2, 2004

(54) PHASE DETECTOR FOR CLOCK AND DATA RECOVERY

(75) Inventors: James D. Chlipala, Emmaus, PA (US); John M. Khoury, Basking Ridge, NJ (US); Kadaba R. Lakshmikumar, Basking Ridge, NJ (US); Peter C. Metz, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 618 days.

(21) Appl. No.: 09/583,115

(22) Filed: May 30, 2000

Related U.S. Application Data

(60) Provisional application No. 60/169,895, filed on Dec. 9, 1999.

(51) Int. Cl.[7] .................................................. H03D 3/24
(52) U.S. Cl. ........................ 375/376; 375/375; 327/156
(58) Field of Search ................................ 375/375, 376, 375/374; 327/156, 157, 2, 7, 8

(56) References Cited

U.S. PATENT DOCUMENTS

| | | | |
|---|---|---|---|
| 4,535,459 A | 8/1985 | Hogge, Jr. ................... 375/80 |
| 5,027,085 A * | 6/1991 | DeVito ........................ 375/376 |
| 5,640,523 A | 6/1997 | Williams ..................... 375/360 |
| 5,799,048 A | 8/1998 | Farjad-Rad et al. ........ 375/360 |
| 5,809,097 A | 9/1998 | Lakshmikumar ............ 375/376 |
| 5,953,386 A * | 9/1999 | Anderson .................... 375/376 |
| 6,034,554 A * | 3/2000 | Francis et al. ................. 327/7 |
| 6,483,871 B1 * | 11/2002 | Dawe ........................... 375/376 |

* cited by examiner

*Primary Examiner*—Temesghen Ghebretinsae
(74) *Attorney, Agent, or Firm*—Duane Morris LLP

(57) ABSTRACT

A method and apparatus for detecting the phase difference between an input data signal and a local clock signal is provided. An input data signal is frequency divided and then fed through a series connection of a pair of data latches. Signals provided at the input and outputs of the pair of the data latches are exclusively-ORed to provide a variable width pulse signal and a reference pulse signal that may be used in a phase-locked loop to align the local clock with the input data signal in a predetermined phase relationship. A re-timed data signal is provided by inputting the input data signal to a data latch clocked with an inverted phase-aligned clock signal.

24 Claims, 7 Drawing Sheets

PHASE DETECTOR FOR CLOCK AND DATA RECOVERY

CROSS-REFERENCE TO RELATED APPLICATIONS

This application claims priority from U.S. provisional application Ser. No. 60/169,895, filed Dec. 9, 1999 and entitled "Phase Detector For Clock and Data Recovery."

FIELD OF THE INVENTION

The present invention is related to clock and data recovery from digital data signals, and more specifically to a method and apparatus for detection of the phase difference between a data signal and a local clock and for phase aligning the data signal and local clock.

DESCRIPTION OF THE RELATED ART

In order to recover data from a transmitted digital data signal, it is desirable to match the frequency of a local clock with the frequency of the data signal and align the local clock with the incoming data stream in a predetermined phase relationship. This phase relationship is chosen to minimize the chance of error during data recovery due to such phenomenon as jitter. This may be accomplished by detecting the phase difference between the transmitted data signal and a local clock and using the detected phase difference to properly align the data stream with a local clock. For example, it may be desirable to align the rising edge of a local clock with the center of an incoming data bit. A properly aligned data signal and clock are considered phase-locked.

FIG. 1 illustrates a prior art phase detector commonly known as the Hogge detector. The Hogge detector is described in U.S. Pat. No. 4,535,459 to Hogge, Jr., the entirety of which is incorporated herein by reference. The Hogge detector 10 includes two data latches 12, 14 that are D flip-flops. The detector 10 generates a variable width pulse signal UP at exclusive OR gate 16 and a reference pulse DOWN at exclusive OR gate 18. The width of the UP pulse indicates whether a local oscillator generating the local clock signal must change phase to align itself with an input data stream.

FIG. 5 is a timing diagram for the Hogge detector. The waveforms of FIG. 5 are labeled to correspond with the signals at the various leads of FIG. 1. The timing diagram indicates that the circuit is balanced. The rising edge of the clock signal is correctly aligned with the center of an incoming data bit. The width of the UP pulse and the width of the DOWN pulse are also equal, further indicating that data stream and local clock are phase-locked.

FIG. 2 illustrates a prior art phase-locked loop 20 that includes Hogge detector 10. The phase-locked loop 20 is also described in U.S. Pat. No. 4,535,459, as well as U.S. Pat. No. 5,799,048 to Farjad-Rad et al., the entirety of which are incorporated herein by reference. Briefly, the UP and DOWN signals are summed and integrated by charge pump circuit 22, which may be of any conventional design. The charge pump 22 produces a control voltage ($V_{control}$) which is inputted to a voltage controlled oscillator (VCO) 24. VCO 24 adjusts the phase of the clock signal in response to the value of $V_{control}$. If the clock signal is advanced relative to the center of the data bits of an input data signal, the width of the UP pulse is narrower than the width of the DOWN pulse, causing a negative shift in $V_{control}$. VCO 24 then retards the clock signal until $V_{control}$ indicates that the UP pulse and DOWN pulse have equal widths, and that phase-lock or balance has occurred. Similarly, if the clock signal is retarded with respect to the center of the data bits of an input data signal, the width of the UP pulse is greater than the constant width of the DOWN pulse, causing a positive shift in $V_{control}$. VCO 24 then advances the clock signal until $V_{control}$ indicates that the UP pulse and DOWN pulse have equal widths, and that phase-lock has occurred.

One disadvantage of the Hogge detector is that the flip-flops 12, 14 used in the detector 10 and phase-locked loop 20 need to be very fast. Higher frequency data rates have smaller data bit periods and are thus more sensitive to delays through circuit elements. The flip-flops preferably have a clock-to-Q delay of less than half the clock period. This delay may vary, but for illustrative purposes, this delay is shown in the timing diagram of FIG. 5 as a one-quarter period (T/4) delay at $Q_{up}$ and $Q_{down}$. A delay of one-quarter period is also shown in the UP and DOWN waveforms, due to delays through exclusive OR gates 16, 18, respectively. For a 2.5 Gbps system, this half period is 200 ps. To accommodate jitter and other manufacturing margins, this number would be expected to be less than 150 ps. This requirement calls for very fast flip-flops. Such flip-flops, even if the process technology is supportive, consume a great deal of power.

A further disadvantage of the Hogge detector 10 is the need for delay element 24. The delay element 24 is used in the Hogge detector 10 to mimic the clock-to-Q delay of a flip-flop. Such a delay element is required to place the clock edge exactly at the center of an incoming data bit at phase-lock. Without the delay element 24, the clock edges will be a little bit to the left or right of the data edges, resulting in a loss of margin and a greater likelihood that noise will cause an error in recovering the data. Therefore, significant design efforts are expended on the delay element.

Further, the Hogge detector 10 produces narrow UP and DOWN pulses of one half period at phase-lock, as indicated in FIG. 5. Short pulses place greater demands on the response time and ability of the charge pump 22. Further, a loop may be non-responsive to smaller differences between narrow UP and DOWN pulses.

Therefore, there is currently a need to eliminate the dependence of a phase detector on a delay element, as well as reduce the power consumed by the flip-flops of a phase detector. Further, it is desirable to allow the charge pump of a phase-locked loop a longer response time to differences between UP and DOWN pulses, and thus a better response to smaller phase differences between an input data stream and a local clock.

SUMMARY OF THE INVENTION

The present invention is a method and apparatus for determining the phase difference between an incoming data stream and a local clock, as well as a method and apparatus for phase aligning a local clock with the incoming data stream. A phase detector for outputting a reference pulse and a variable width pulse indicative of the phase difference between the local clock and the incoming data stream is provided. The phase detector includes a means for frequency dividing the input data signal and a plurality of data latches connected in series. The frequency divided signal is passed through the series of data latches, and signals at the data inputs and data outputs of each data latch are inputted to a first and second exclusive OR gates to provide the variable width pulse and the reference pulse, respectively. The phase detector may also include a fourth data latch clocked with an inverted clock signal to provide a re-timed data signal at its output.

The phase-locked loop according to the present invention includes the above-described phase detector and a charge pump circuit coupled to the outputs of the first and second exclusive OR gates. The charge pump sums and integrates the variable width and reference pulses to provide a control voltage to a voltage controlled oscillator. The voltage controlled oscillator provides the clock signal for clocking the data latches of the phase detector.

The present invention provides several benefits. The phase detector and phase-locked loop function even with set up time plus clock-to-Q delays of a full clock period. This allows for functional designs having slower flip-flops that consume less power. The phase-detector of the present invention also performs admirably without a delay element. Further, the phase detector of the present invention produces variable width pulses and reference pulses that are twice as wide as those of the Hogge detector 10, thereby permitting the phase-locked loop to be more responsive to smaller differences in phase between the input data stream and the clock signal. Therefore, the "dead zone," or zone where the difference in phase is too small for the phase loop to respond, is minimized. This feature is very beneficial in circuits designed for high data rates.

The above and other features of the present invention will be better understood from the following detailed description of the preferred embodiments of the invention that is provided in connection with the accompanying drawings.

DETAILED DESCRIPTION

Figure 1:
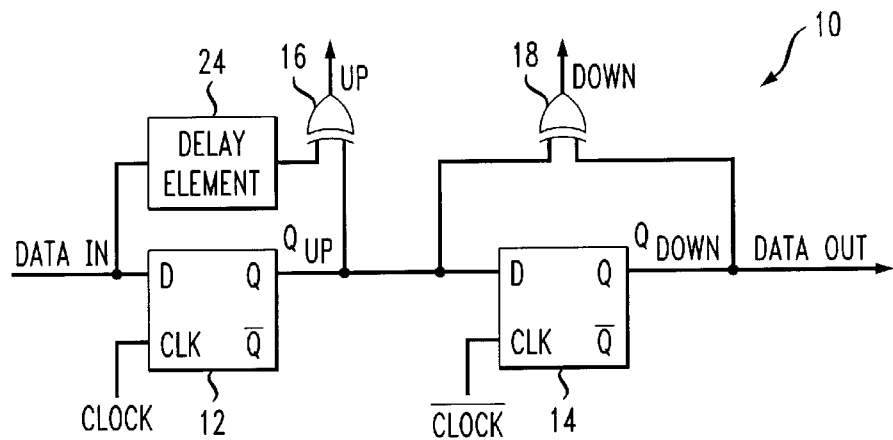
FIG. 1 a circuit diagram of a prior art phase detector.
Figure 2:
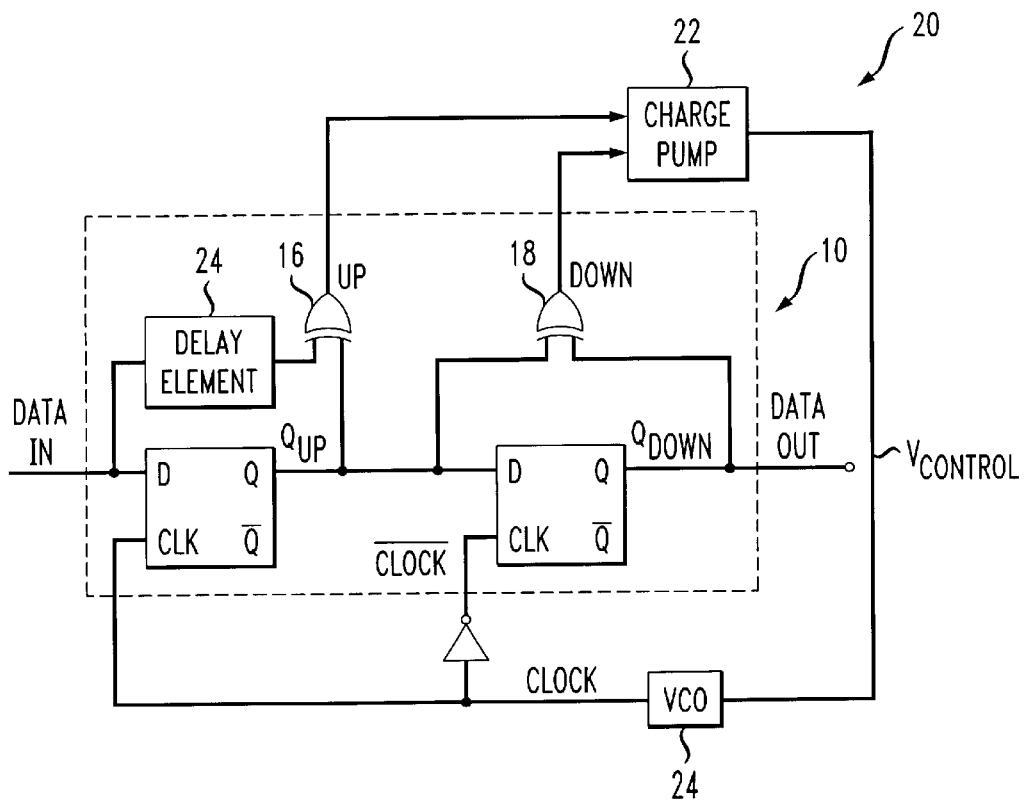
FIG. 2 is a circuit diagram of a prior art phase-locked loop including the phase detector of FIG. 1.
Figure 3:
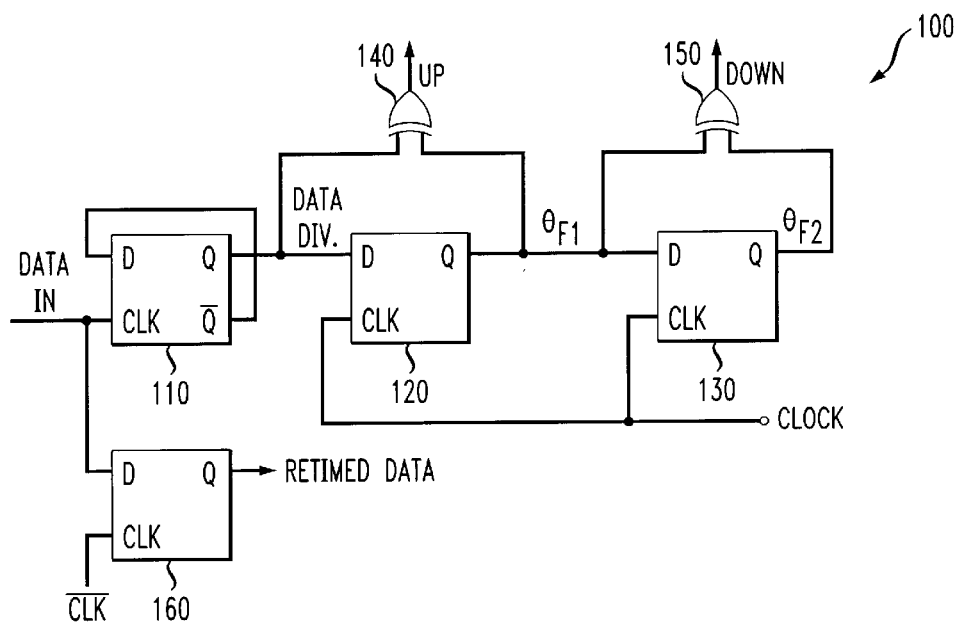
FIG. 3 is a circuit diagram of an exemplary phase detector according to the present invention.

FIG. 3 is a circuit diagram of an exemplary phase detector 100 according to the present invention. The phase detector 100 includes a frequency divider that is preferably a first data latch 110. Data latch 110 may be a D flip-flop which includes a data input D, a clock input CLK, a data output Q, and an inverted data output $\overline{Q}$. The CLK input is coupled to an input data stream (Data In), and the $\overline{Q}$ output is coupled to the D input. A frequency divided data input data signal (Data Div.) is outputted at the Q output of first data latch 110. Referring to the timing diagram shown in FIG. 6, an input data signal waveform is illustrated. The diagram shows that the frequency of Data Div. is half that of the input data signal, i.e., the period (2T) of Data Div. is twice the period (T) of the input data signal.

The frequency divider may divide the frequency of Data In by any integer. For example, a pair of D flip-flops 110 may be coupled to each other to provide a Data Div. signal having a fourth of the frequency of the input data signal.

The phase detector 100 also includes second and third data latches 120, 130, respectively, which may also be D flip-flops. Both data latches 120, 130 are clocked by a local clock signal. The Data Div. signal is coupled to the data input of the second data latch 120. Output signal $\theta_{F1}$ is outputted at the Q output of data latch 120. The frequency divided data input signal and output signal $\theta_{F1}$ are coupled to first exclusive OR gate 140. The UP signal is provided at the output of exclusive OR gate 140. The UP signal is a variable width pulse signal which may be used in a phase-locked loop, as is described in conjunction with the Hogge detector above and the present invention below.

Output signal $\theta_{F1}$ is also coupled to the D input of third data latch 130. Output signal $\theta_{F2}$ is provided at output Q of third data latch 130, and both output signal $\theta_{F2}$ and output signal $\theta_{F1}$ are coupled to the inputs of second exclusive OR gate 150. Reference pulse DOWN is provided at the output of second exclusive OR gate 150. Like variable width pulse UP, reference pulse DOWN may be used in a phase-locked loop.

Phase detector 100 may also include a fourth data latch 160. Data latch 160 may be a D flip-flop with D input coupled to the data input signal. Data latch 160 is clocked with inverted local clock signal $\overline{CLK}$. A re-timed data signal is produced at output Q of fourth data latch 160.

Figure 4:
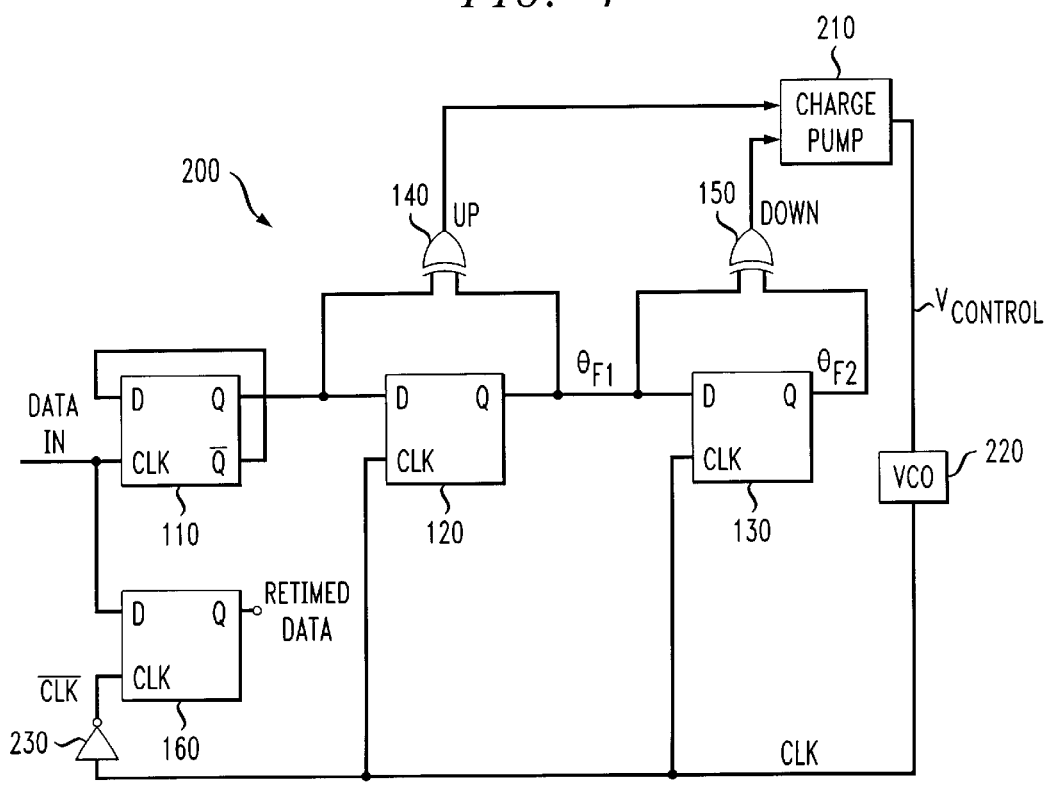
FIG. 4 is a circuit diagram of an exemplary phase-locked loop according to the present invention including the phase detector of FIG. 3.
Figure 5:
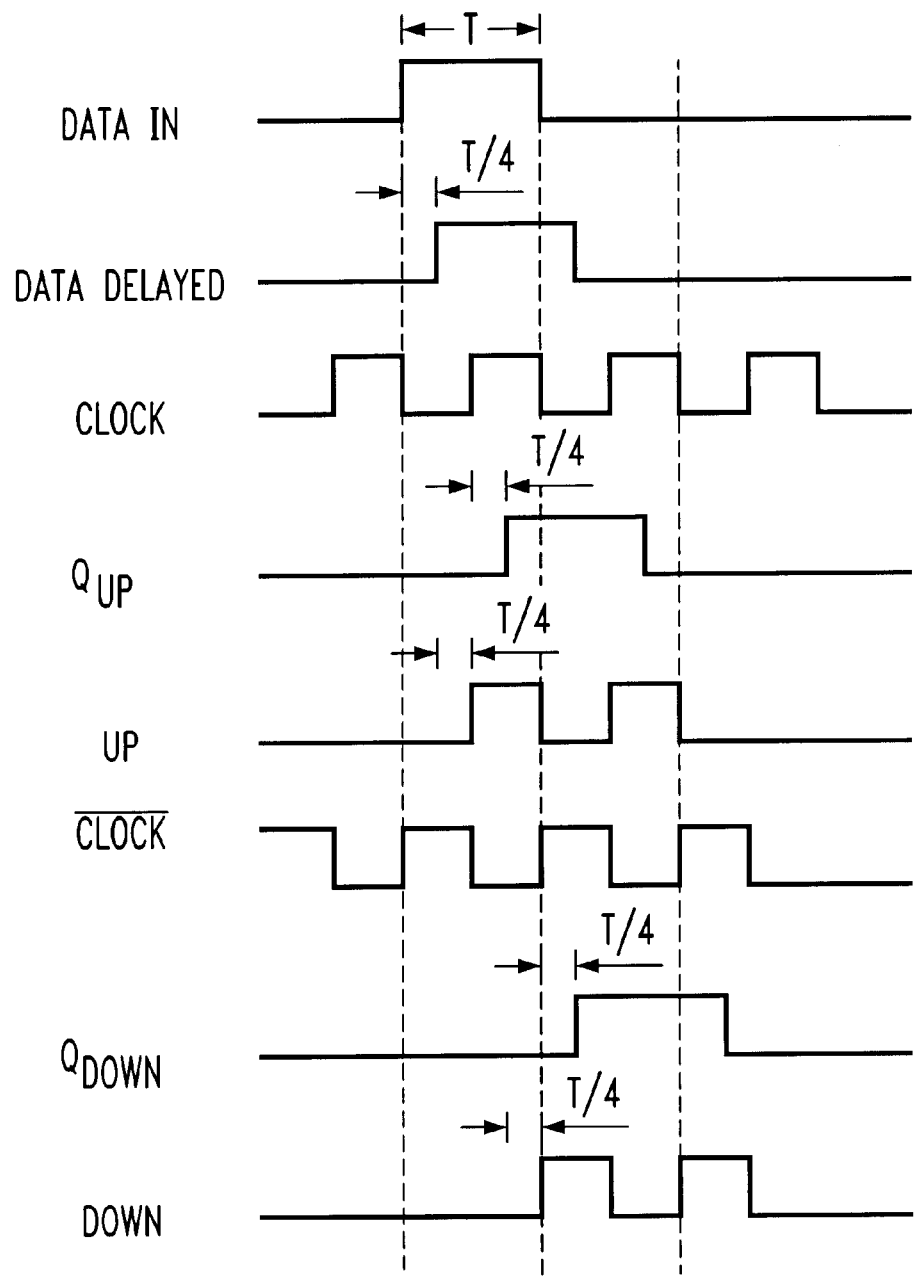
FIG. 5 is a timing diagram illustrating that the prior art phase detector of FIG. 1 is balanced.

FIG. 4 is a circuit diagram of a phase-locked loop 200 including phase detector 100. The operation of phase-locked loop 200 is described in U.S. Pat. No. 4,535,459 to Hogge Jr. and U.S. Pat. No. 5,799,048 to Faijad-Rad et al., the entirety of which is incorporated by reference herein. UP and DOWN signals provided at the outputs of first and second exclusive OR gates 140, 150, respectively, are inputted to charge pump 210. Charge pump 210 essentially sums and integrates signals UP and DOWN to produce a control voltage ($V_{control}$) indicative of the difference between the UP and DOWN pulses and thus indicative of the phase difference between the local clock and the input data stream. Signal $V_{control}$ is provided as an input to a voltage controlled oscillator (VCO) 220. Voltage controlled oscillator 220 outputs a clock signal CLK at its output. VCO 220 adjusts the phase of the clock signal based on the value of $V_{control}$ in order to properly align the clock signal and an input data signal.

The phase-locked loop 200 may include an inverter 230 with input coupled to VCO 220 and output coupled to the clock input of fourth data latch 160. Inverted clock signal $\overline{CLK}$ is provided at the output of inverter 230 and used as a clock signal for fourth data latch 160.

Figure 6:
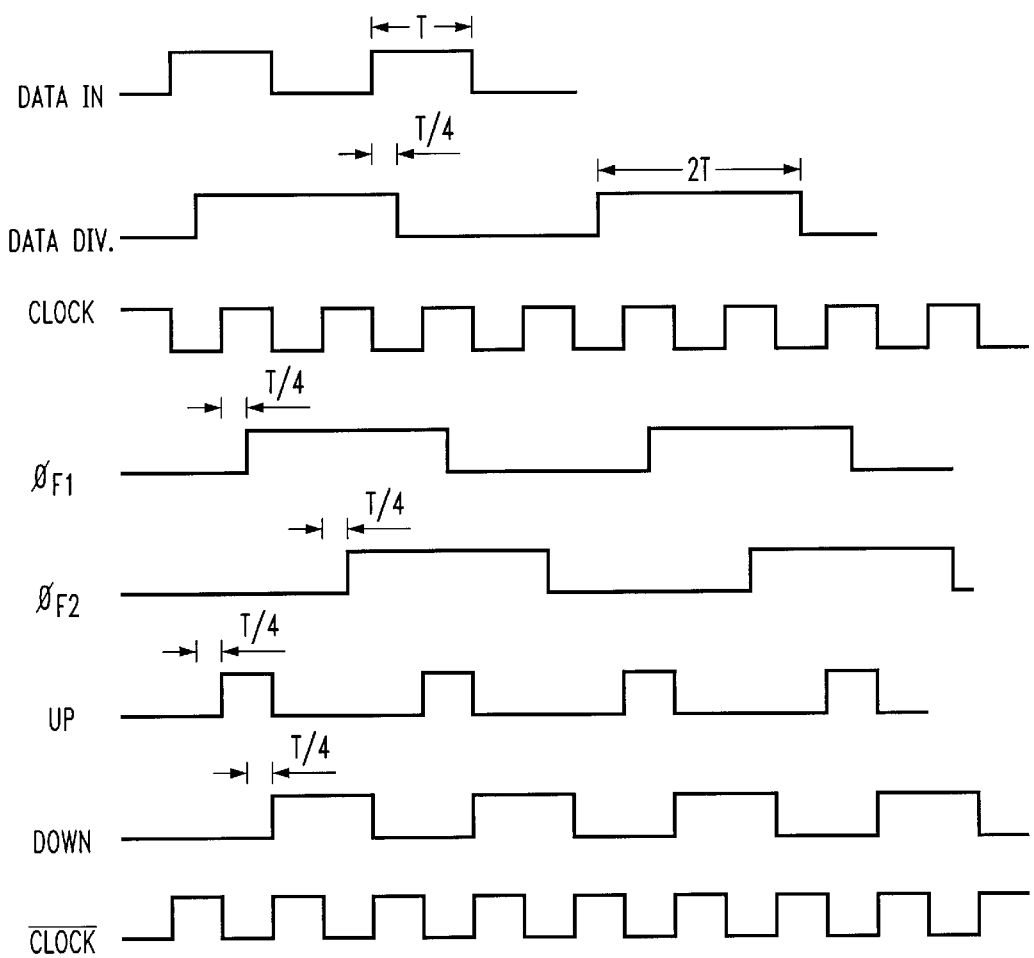
FIG. 6 is a timing diagram illustrating that the phase detector of FIG. 3 is not balanced.
Figure 7:
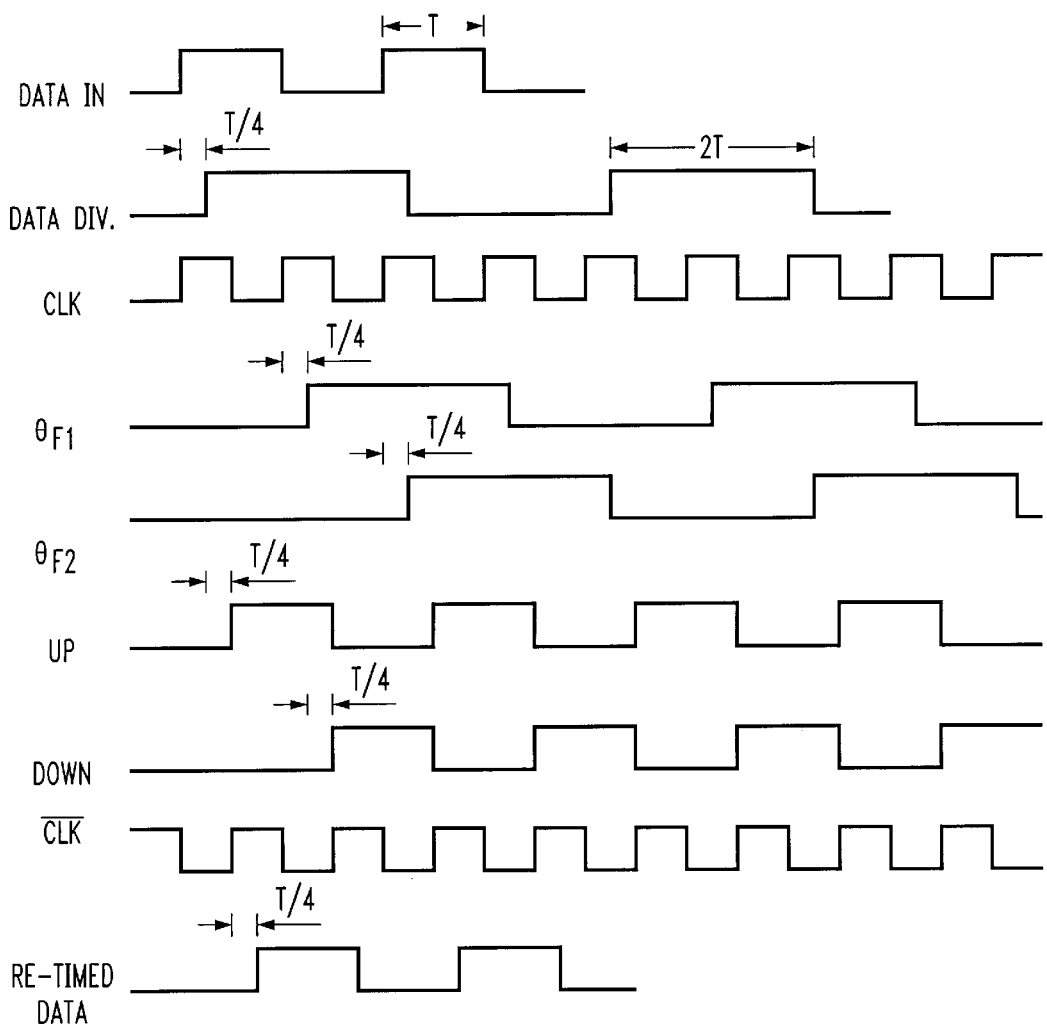
FIG. 7 is a timing diagram illustrating that the phase detector of FIG. 3 is balanced.

FIGS. 6 and 7 are timing diagrams for the phase detector 100 of FIG. 3. FIG. 6 illustrates that the clock signal and the input data signal are not properly aligned, and thus a phase-locked loop, such as phase-locked loop 200, must operate to properly align the local clock and the input data signal. The phase detector 100 of the present invention is preferably designed such that balance (phase-lock) occurs when the rising edge of the clock signal is aligned with the edges of the input data bits. FIG. 7 illustrates that in this balance state, the UP and DOWN pulses have equal widths. The input data signal and the local clock are thus in proper phase alignment. A re-timed data signal is provided by clocking Data In with $\overline{CLK}$, $\overline{CLK}$ having a rising edge at the center of the data bits of Data In at phase-lock.

FIG. 6 is a timing diagram illustrating that the clock signal and input data signal are not in proper phase alignment. Indeed, the clock signal rising edge is aligned with the center of the data bits of Data In. The difference in width between the UP and DOWN pulses illustrates an undesirable phase alignment between the clock signal and input data stream. FIG. 6 shows that the rising edges of $\overline{CLK}$ are not aligned with the centers of the data bits of Data In, thereby increasing the potential for improper data recovery. In this situation, a phase-locked loop 200 works to properly align these two signals until the relationship of FIG. 7 is achieved.

The present invention provides several benefits. The above-described phase detector and phase-locked loop function even with set up time plus clock-to-Q delays of a full clock period. This allows for functional designs having slower flip-flops. Slower flip-flops in turn consume less power.

Also, as mentioned, a disadvantage of the Hogge detector 10 is the need for delay element 24. The phase-detector of the present invention performs admirably without a delay element. Because the rising edges of the clock signal are aligned with the edges of the input data signal at equilibrium, the falling edge of the clock, i.e, the rising edge of $\overline{CLK}$, may be used to re-time the data because its edge is properly aligned in the center of the data bits of an input data stream.

Further, the phase detector of the present invention produces UP and DOWN pulses that are twice as wide as those of the prior art Hogge detector 10, i.e., a full clock period, assuming the same data rate and the same clock frequencies. One of the limiting factors of a phase-locked loop is how fast it can respond to phase differences between the local clock and the input data stream. Because the UP and DOWN pulses are wider, the phase-locked loop 200 is more responsive to smaller differences in phase between the input data stream and the clock signal. Therefore, the "dead zone," or zone where the difference in phase is too small for the phase loop to respond, is minimized. This feature is very desirable in circuits designed for high data rates.

Figure 8:
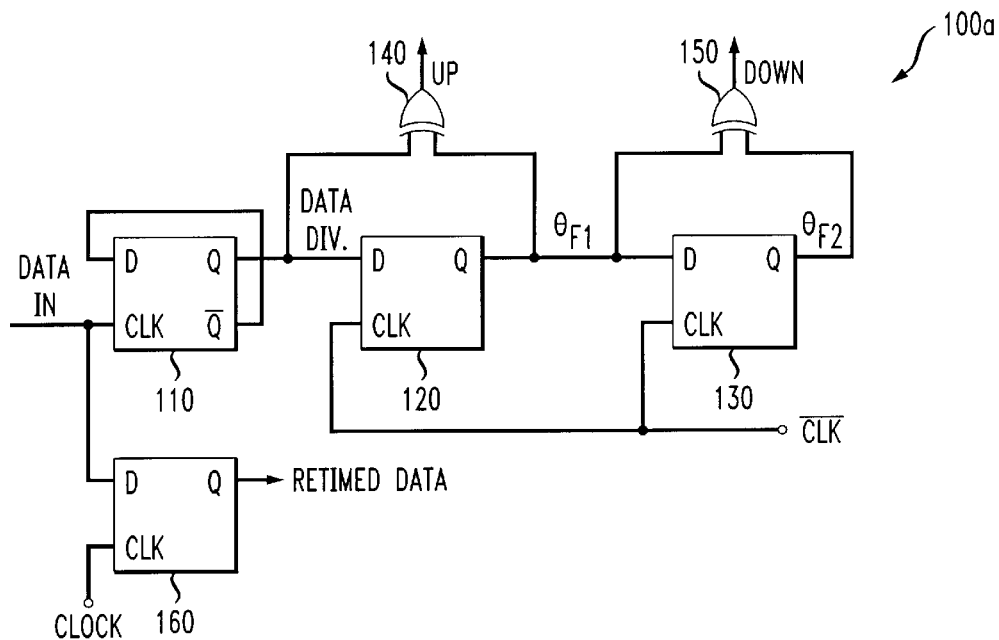
FIG. 8 is a circuit diagram of another exemplary phase detector according to the present invention.
Figure 9:
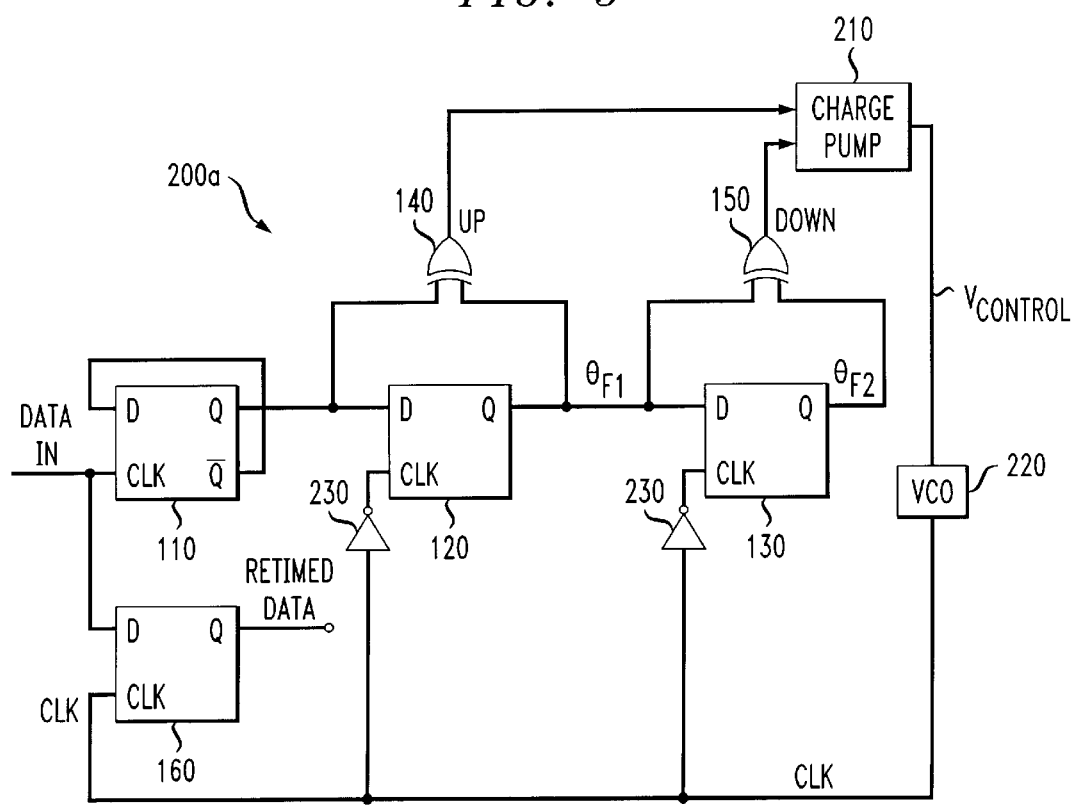
FIG. 9 is a circuit diagram of another exemplary phase-locked loop according to the present invention including the phase detector of FIG. 8.
Figure 10:
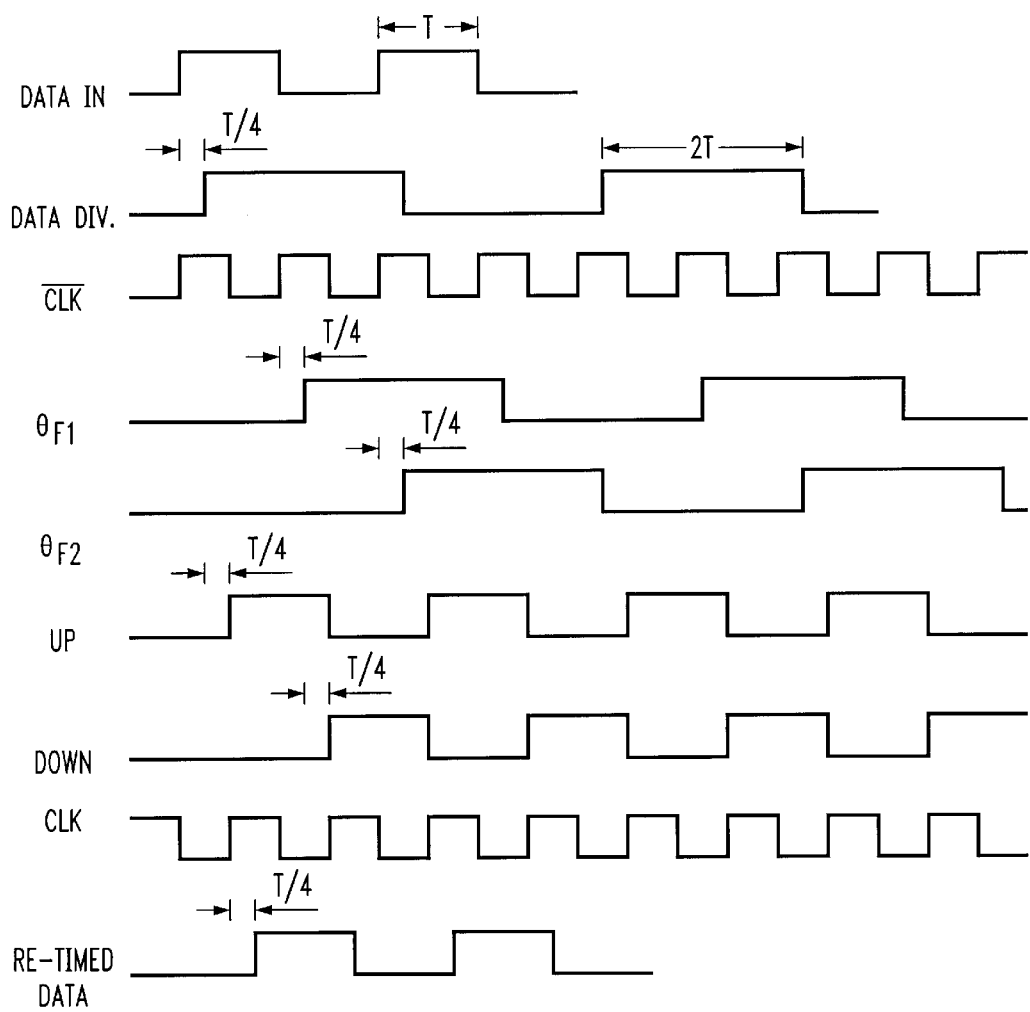
FIG. 10 is a timing diagram illustrating the phase detector of FIG. 8 is balanced.

Referring to FIGS. 8 and 9, in another exemplary embodiment of the present invention, the phase detector 100 may be modified by clocking data latch 120 and data latch 130 with inverted clock signal $\overline{CLK}$, instead of clock signal CLK. In this embodiment, data latch 160 is clocked with clock signal CLK to produce a re-timed data signal. It should be apparent that inverter 230 shown in FIG. 4 could be then removed to allow CLK to clock data latch 160 and that inverters may be connected between VCO 220 and the clock inputs of data latches 120, 130 to clock data latches 120, 130 with $\overline{CLK}$. In this manner, proper phase alignment is achieved when the rising edges of $\overline{CLK}$ are aligned with the Data In signal edges as shown in FIG. 10.

Referring to FIG. 4 and FIG. 9, the $\overline{CLK}$ signal is illustrated as being generated from the CLK signal using single ended logic, namely by inverter 230. An inverter 230 may also add a propagation delay, e.g., a quarter period, (not shown in FIGS. 6, 7 and 10). If such a delay is created, this propagation delay re-times the Data In signal of FIG. 4 with a delayed $\overline{CLK}$ signal. This re-timing using a clock input to a data latch 160 which exhibits a phase difference from the clock inputs to data latches 120, 130 reduces the noise immunity margin of the circuit. The noise immunity reduction may be eliminated by introducing, in the circuit 200, delay elements between the output of VCO 220 and the clock inputs of data latches 120, 130 in order to mimic the propagation delay through inverter 230. Similarly, in circuit 200a of FIG. 9, a delay element may be introduced between the output of VCO 220 and the clock input of data latch 160.

Alternatively, the propagation delay in generating the $\overline{CLK}$ signal may be eliminated by using differential logic for VCO 220. In this manner, VCO 220 generates a CLK signal and a $\overline{CLK}$ signal, with no delay present in the $\overline{CLK}$ signal (as shown in the timing diagrams of FIGS. 6, 7 and 10). The CLK signal and $\overline{CLK}$ signal each exhibit a 180 degree phase relationship to the other and may be directly coupled to the desired clock inputs of the data latches 120, 130, and 160 of FIGS. 4 and 9 without including inverter 230. Similarly, if the data latches 120, 130, and 160 are created using differential logic, each data latch has a CLK and $\overline{CLK}$ input. To effect an inversion, i.e., to clock a data latch with $\overline{CLK}$ rather than CLK, the CLK output of VCO 220 is connected to the $\overline{CLK}$ input of the data latch and the $\overline{CLK}$ output of VCO 220 is connected to the CLK input of the data latch. This configuration results in no delay-caused phase difference between the CLK signal and $\overline{CLK}$ signal (as shown in the timing diagrams of FIGS. 6, 7 and 10).

Although the invention has been described in terms of exemplary embodiments, it is not limited thereto. Rather, the appended claims should be construed broadly, to include other variants and embodiments of the invention which may be made by those skilled in the art without departing from the scope and range of equivalents of the invention.

What is claimed is:

1. A phase detector for outputting a variable width pulse indicative of phase difference and a reference pulse as phase detector outputs, comprising:
   (a) means for frequency dividing an input data signal, said dividing means providing at a data output a frequency divided data signal corresponding to said input data signal;
   (b) a second data latch, said second data latch comprising a clock input coupled to a clock signal selected from the group consisting of a first clock signal and an inverted first clock signal, a data input coupled to an output of said means for frequency dividing, and a data output;
   (c) a first exclusive OR gate, comprising a first and second inputs and an output, said first and second inputs coupled to said data output of said dividing means and said data output of said second data latch, respectively, said first exclusive OR gate providing said variable width pulse at said output;
   (d) a third data latch, said third data latch comprising a clock input coupled to said clock signal, a data input coupled to said second data latch data output, and a data output; and
   (e) a second exclusive OR gate, comprising a first and second inputs and an output, said first and second inputs coupled to said data outputs of said second and third data latches, respectively, said second exclusive OR gate providing said reference pulse at said output.

2. The phase detector of claim 1, wherein said data latches are D flip-flops.

3. The phase detector of claim 1, further comprising a fourth data latch, said fourth data latch comprising a clock input coupled to an inverted clock signal, a data input coupled to said data input signal, and a data output, said data output outputting a re-timed data input signal.

4. The phase detector of claim 3, wherein said fourth data latch is a D flip-flop.

5. The phase detector of claim 1, wherein said means for frequency dividing is a first data latch, said first data latch comprising a clock input coupled to said input data signal, an inverted data output coupled to a data input, and a data output, said first data latch outputting a frequency divided input data signal at said data output.

6. The phase detector of claim 5, wherein said first data latch is a D flip-flop.

7. A phase detector for outputting a variable width pulse indicative of phase difference and a reference pulse as phase detector outputs, comprising:
(a) a first data latch, said first data latch comprising a clock input coupled to an input data signal, an inverted data output coupled to a data input of said first data latch, and a data output, said fist data latch outputting a frequency divided input data signal at said data output;
(b) a second data latch, said second data latch comprising a clock input coupled to a clock signal selected from the group consisting of a first clock signal and an inverted first clock signal, a data input coupled to said first data latch data output, and a data output;
(c) a first exclusive OR gate, comprising a first and second inputs and an output, said first and second inputs coupled to said data outputs of said first and second data latches, respectively, said first exclusive OR gate providing said variable width pulse at said output;
(d) a third data latch, said third data latch comprising a clock input coupled to said clock signal, a data input coupled to said second data latch data output, and a data output; and
(e) a second exclusive OR gate, comprising a first and second inputs and an output, said first and second inputs coupled to said data outputs of said second and third data latches, respectively, said second exclusive OR gate providing said reference pulse at said output.

8. The phase detector of claim 7, wherein said data latches are D flip-flops.

9. The phase detector of claim 7, further comprising a fourth data latch, said fourth data latch comprising a clock input coupled to an inverted clock signal, a data input coupled to said data input signal, and a data output, said data output outputting a re-timed data input signal.

10. The phase detector of claim 9, wherein said fourth data latch is a D flip-flop.

11. A phase-locked loop, comprising:
(a) means for frequency dividing an input data signal, said dividing means providing at a data output a frequency divided data signal corresponding to said input data signal;
(b) a second data latch, said second data latch comprising a clock input coupled to a clock signal selected from the group consisting of a first clock signal and an inverted first clock signal, a data input coupled to an output of said means for frequency dividing, and a data output;
(c) a first exclusive OR gate, comprising a first and second inputs and an output, said first and second inputs coupled to a data output of said dividing means and said data output of said second data latch, respectively, said first exclusive OR gate providing said variable width pulse at said output;
(d) a third data latch, said third data latch comprising a clock input coupled to said clock signal, a data input coupled to said second data latch data output, and a data output;
(e) a second exclusive OR gate, comprising a first and second inputs and an output, said first and second inputs coupled to said data outputs of said second and third data latches, respectively, said second exclusive OR gate providing said reference pulse at said output;
(f) a charge pump circuit coupled to said outputs of said first and second exclusive OR gates, said charge pump providing a control voltage at a charge pump output from said variable width pulse and said reference pulse; and
(g) a voltage controlled oscillator coupled to said charge pump output and controlled by said control voltage, said voltage controlled oscillator outputting said first clock signal at a voltage controlled oscillator output.

12. The phase-locked loop of claim 11, wherein said latches are D flip-flops.

13. The phase-locked loop of claim 11, further comprising a fourth data latch, said fourth data latch comprising a clock input coupled to an inverted clock signal, a data input coupled to said data input signal, and a data output, said data output outputting a re-timed data input signal.

14. The phase-locked loop of claim 13, wherein said fourth data latch is a D flip-flop.

15. The phase-locked loop of claim 11, wherein said means for frequency dividing is a first data latch, said first data latch comprising a clock input coupled to said input data signal, an inverted data output coupled to a data input, and a data output, said first data latch outputting a frequency divided input data signal at said data output.

16. The phase-locked loop of claim 15, wherein said first data latch is a D flip-flop.

17. A method of processing an input data signal, comprising:
(a) generating a frequency divided data signal from said input data signal, said frequency divided data signal corresponding to said input data signal;
(b) passing said frequency divided data signal through a plurality of data latches connected in series, each data latch including a data input, a clock input, and a data output; and
(c) exclusive ORing signals at said data inputs and data outputs of each data latch to generate a variable width pulse and a reference pulse, respectively.

18. The method of claim 17, wherein said frequency divided data signal has a frequency approximately half of the frequency of said input data signal.

19. The method of claim 17, wherein the step of generating said frequency divided data signal comprises the steps of providing a data latch including clock input, data input, data output, and inverted data output, clocking said data latch with said input data signal at said clock input, coupling said inverted data output to said data input, and outputting said divided data signal at said data output.

20. The method of claim 17, wherein said data latches are D flip-flops.

21. The method of claim 17, further comprising the step of aligning said input data signal with a clock signal.

22. The method of claim 21, wherein the step of aligning said input data signal with said clock signal comprises the following steps:
differentially integrating and summing said variable width pulse and said reference pulse to provide a control signal;
generating a variable frequency clock signal in response to the control signal; and
clocking said data latches with said clock signal, said clock signal selected from the group consisting of said variable frequency clock signal and an inverted variable frequency clock signal.

23. The method of claim 22, further comprising the steps of passing said data signal through a data latch clocked with an inverted clock signal to generate a re-timed data signal.

24. The method of claim 23, wherein said data latches are D flip-flops.

* * * * *